United States Patent
Chen et al.

(10) Patent No.: US 7,902,080 B2
(45) Date of Patent: Mar. 8, 2011

(54) DEPOSITION-PLASMA CURE CYCLE PROCESS TO ENHANCE FILM QUALITY OF SILICON DIOXIDE

(75) Inventors: Xiaolin Chen, San Jose, CA (US); Srinivas D. Nemani, Sunnyvale, CA (US); Shankar Venkataraman, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 910 days.

(21) Appl. No.: 11/753,968

(22) Filed: May 25, 2007

(65) Prior Publication Data
US 2007/0281448 A1    Dec. 6, 2007

Related U.S. Application Data

(60) Provisional application No. 60/803,481, filed on May 30, 2006.

(51) Int. Cl.
*H01L 21/302* (2006.01)
(52) U.S. Cl. ......... 438/723; 438/706; 438/725; 438/743; 216/80
(58) Field of Classification Search .................. 438/706, 438/713, 725, 714, 743, 710, 723; 216/58, 216/80
See application file for complete search history.

(56) References Cited

U.S. PATENT DOCUMENTS

| | | | |
|---|---|---|---|
| 4,147,571 A | 4/1979 | Stringfellow et al. | |
| 4,816,098 A | 3/1989 | Davis et al. | |
| 4,818,326 A | 4/1989 | Liu et al. | |
| 4,931,354 A | 6/1990 | Wakino et al. | |
| 5,016,332 A | 5/1991 | Reichelderfer et al. | |
| 5,110,407 A | 5/1992 | Ono et al. | |
| 5,393,708 A * | 2/1995 | Hsia et al. ..................... | 438/699 |
| 5,426,076 A | 6/1995 | Moghadam | |
| 5,558,717 A | 9/1996 | Zhao et al. | |
| 5,587,014 A | 12/1996 | Leychika et al. | |
| 5,622,784 A | 4/1997 | Okaue et al. | |
| 5,635,409 A | 6/1997 | Moslehi | |
| 5,691,009 A | 11/1997 | Sandhu | |
| 5,786,263 A | 7/1998 | Perera | |

(Continued)

FOREIGN PATENT DOCUMENTS

DE    19654737 A1    7/1997

(Continued)

OTHER PUBLICATIONS

Gulleri, G. et al., "Deposition Temperature Determination of HDPCVD Silicon Dioxide Films," 2005, Microelectronic Engineering, vol. 82, pp. 236-241.

(Continued)

*Primary Examiner* — Lan Vinh
(74) *Attorney, Agent, or Firm* — Townsend and Townsend and Crew (57) ABSTRACT

Methods of filling a gap on a substrate with silicon oxide are described. The methods may include the steps of introducing an organo-silicon precursor and an oxygen precursor to a deposition chamber, reacting the precursors to form a first silicon oxide layer in the gap on the substrate, and etching the first silicon oxide layer to reduce the carbon content in the layer. The methods may also include forming a second silicon oxide layer on the first layer, and etching the second layer to reduce the carbon content in the second layer. The silicon oxide layers are annealed after the gap is filled.

30 Claims, 8 Drawing Sheets

U.S. PATENT DOCUMENTS

| | | | |
|---|---|---|---|
| 5,853,607 A | 12/1998 | Zhao et al. | |
| 5,937,308 A | 8/1999 | Gardner et al. | |
| 5,937,323 A | 8/1999 | Orczyk et al. | |
| 6,008,515 A * | 12/1999 | Hsia et al. | 257/309 |
| 6,009,830 A | 1/2000 | Li et al. | |
| 6,024,044 A | 2/2000 | Law et al. | |
| 6,087,243 A | 7/2000 | Wang | |
| 6,090,723 A | 7/2000 | Thakur et al. | |
| 6,140,242 A | 10/2000 | Oh et al. | |
| 6,146,970 A | 11/2000 | Witek et al. | |
| 6,156,581 A | 12/2000 | Vaudo et al. | |
| 6,165,834 A | 12/2000 | Agarwal et al. | |
| 6,180,490 B1 * | 1/2001 | Vassiliev et al. | 438/424 |
| 6,207,587 B1 | 3/2001 | Li et al. | |
| 6,302,964 B1 | 10/2001 | Umotoy et al. | |
| 6,383,954 B1 | 5/2002 | Wang et al. | |
| 6,387,207 B1 | 5/2002 | Janakiraman et al. | |
| 6,406,677 B1 | 6/2002 | Carter et al. | |
| 6,448,187 B2 | 9/2002 | Yau et al. | |
| 6,503,557 B1 | 1/2003 | Joret | |
| 6,506,253 B2 | 1/2003 | Sakuma | |
| 6,508,879 B1 | 1/2003 | Hashimoto | |
| 6,509,283 B1 | 1/2003 | Thomas | |
| 6,524,931 B1 | 2/2003 | Perera | |
| 6,528,332 B2 | 3/2003 | Mahanpour et al. | |
| 6,544,900 B2 | 4/2003 | Raaijmakers et al. | |
| 6,548,416 B2 | 4/2003 | Han et al. | |
| 6,548,899 B2 | 4/2003 | Ross | |
| 6,559,026 B1 | 5/2003 | Rossman et al. | |
| 6,566,278 B1 | 5/2003 | Harvey et al. | |
| 6,596,654 B1 | 7/2003 | Bayman et al. | |
| 6,614,181 B1 | 9/2003 | Harvey et al. | |
| 6,630,413 B2 | 10/2003 | Todd | |
| 6,660,391 B1 | 12/2003 | Rose et al. | |
| 6,676,751 B2 | 1/2004 | Solomon et al. | |
| 6,683,364 B2 | 1/2004 | Oh et al. | |
| 6,716,770 B2 | 4/2004 | O'Neill et al. | |
| 6,756,085 B2 | 6/2004 | Waldfried et al. | |
| 6,787,191 B2 | 9/2004 | Hanahata et al. | |
| 6,794,290 B1 | 9/2004 | Papasouliotis et al. | |
| 6,818,517 B1 | 11/2004 | Maes | |
| 6,830,624 B2 | 12/2004 | Janakiraman et al. | |
| 6,833,052 B2 | 12/2004 | Li et al. | |
| 6,833,322 B2 | 12/2004 | Anderson et al. | |
| 6,867,086 B1 | 3/2005 | Chen et al. | |
| 6,890,403 B2 | 5/2005 | Cheung | |
| 6,900,067 B2 | 5/2005 | Kobayashi et al. | |
| 6,955,836 B2 | 10/2005 | Kumagi et al. | |
| 6,958,112 B2 | 10/2005 | Karim et al. | |
| 7,018,902 B2 | 3/2006 | Visokay et al. | |
| 7,084,076 B2 | 8/2006 | Park et al. | |
| 7,115,419 B2 | 10/2006 | Suzuki | |
| 7,129,185 B2 * | 10/2006 | Aoyama et al. | 438/759 |
| 7,148,155 B1 | 12/2006 | Tarafdar et al. | |
| 7,205,248 B2 | 4/2007 | Li et al. | |
| 7,220,461 B2 | 5/2007 | Hasebe et al. | |
| 7,297,608 B1 * | 11/2007 | Papasouliotis et al. | 438/404 |
| 7,399,388 B2 | 7/2008 | Moghadam et al. | |
| 7,419,903 B2 | 9/2008 | Haukka et al. | |
| 7,435,661 B2 | 10/2008 | Miller et al. | |
| 7,498,273 B2 | 3/2009 | Mallick et al. | |
| 7,524,735 B1 | 4/2009 | Gauri et al. | |
| 7,541,297 B2 | 6/2009 | Mallick et al. | |
| 7,745,352 B2 | 6/2010 | Mallick et al. | |
| 7,790,634 B2 | 9/2010 | Munro et al. | |
| 7,803,722 B2 | 9/2010 | Liang | |
| 7,825,038 B2 | 11/2010 | Ingle et al. | |
| 7,825,044 B2 | 11/2010 | Mallick et al. | |
| 2001/0021595 A1 | 9/2001 | Jang et al. | |
| 2001/0029114 A1 | 10/2001 | Vulpio et al. | |
| 2001/0038919 A1 | 11/2001 | Berry et al. | |
| 2001/0054387 A1 | 12/2001 | Frankel et al. | |
| 2002/0048969 A1 | 4/2002 | Suzuki et al. | |
| 2002/0081817 A1 * | 6/2002 | Bhakta et al. | 438/424 |
| 2002/0127350 A1 | 9/2002 | Ishikawa et al. | |
| 2002/0142585 A1 | 10/2002 | Mandal | |
| 2002/0146879 A1 | 10/2002 | Fu et al. | |
| 2002/0164891 A1 | 11/2002 | Gates et al. | |
| 2003/0064154 A1 | 4/2003 | Laxman et al. | |
| 2003/0118748 A1 | 6/2003 | Kumagai et al. | |
| 2003/0124873 A1 | 7/2003 | Xing et al. | |
| 2003/0143841 A1 | 7/2003 | Yang et al. | |
| 2003/0159656 A1 | 8/2003 | Tan et al. | |
| 2003/0172872 A1 | 9/2003 | Thakur et al. | |
| 2003/0199151 A1 | 10/2003 | Ho et al. | |
| 2003/0232495 A1 | 12/2003 | Moghadam et al. | |
| 2004/0008334 A1 | 1/2004 | Sreenivasan et al. | |
| 2004/0020601 A1 * | 2/2004 | Zhao et al. | 156/345.32 |
| 2004/0048492 A1 | 3/2004 | Ishikawa et al. | |
| 2004/0065253 A1 | 4/2004 | Pois et al. | |
| 2004/0079118 A1 | 4/2004 | M'Saad et al. | |
| 2004/0146661 A1 | 7/2004 | Kapoor et al. | |
| 2004/0152342 A1 | 8/2004 | Li et al. | |
| 2004/0161899 A1 | 8/2004 | Luo et al. | |
| 2004/0175501 A1 | 9/2004 | Lukas et al. | |
| 2004/0180557 A1 | 9/2004 | Park et al. | |
| 2004/0185641 A1 | 9/2004 | Tanabe et al. | |
| 2004/0219780 A1 * | 11/2004 | Ohuchi | 438/637 |
| 2004/0241342 A1 | 12/2004 | Karim et al. | |
| 2005/0001556 A1 | 1/2005 | Hoffman et al. | |
| 2005/0019494 A1 | 1/2005 | Moghadam et al. | |
| 2005/0026443 A1 * | 2/2005 | Goo et al. | 438/694 |
| 2005/0062165 A1 | 3/2005 | Saenger et al. | |
| 2005/0087140 A1 | 4/2005 | Yuda et al. | |
| 2005/0142895 A1 | 6/2005 | Ingle et al. | |
| 2005/0153574 A1 | 7/2005 | Mandal | |
| 2005/0181555 A1 | 8/2005 | Haukka et al. | |
| 2005/0186731 A1 | 8/2005 | Derderian et al. | |
| 2005/0196533 A1 | 9/2005 | Hasebe et al. | |
| 2005/0227499 A1 | 10/2005 | Park et al. | |
| 2005/0250340 A1 | 11/2005 | Chen et al. | |
| 2006/0011984 A1 | 1/2006 | Curie | |
| 2006/0014399 A1 | 1/2006 | Joe | |
| 2006/0030165 A1 | 2/2006 | Ingle et al. | |
| 2006/0055004 A1 | 3/2006 | Gates et al. | |
| 2006/0068599 A1 | 3/2006 | Baek et al. | |
| 2006/0096540 A1 | 5/2006 | Choi | |
| 2006/0110943 A1 | 5/2006 | Swerts et al. | |
| 2006/0121394 A1 | 6/2006 | Chi | |
| 2006/0162661 A1 | 7/2006 | Jung et al. | |
| 2006/0178018 A1 | 8/2006 | Olsen | |
| 2006/0223315 A1 | 10/2006 | Yokota et al. | |
| 2006/0228903 A1 | 10/2006 | McSwiney et al. | |
| 2006/0281496 A1 | 12/2006 | Cedraeus | |
| 2006/0286776 A1 | 12/2006 | Ranish et al. | |
| 2007/0020392 A1 | 1/2007 | Kobrin et al. | |
| 2007/0026689 A1 | 2/2007 | Nakata et al. | |
| 2007/0049044 A1 | 3/2007 | Marsh | |
| 2007/0077777 A1 | 4/2007 | Gumpher | |
| 2007/0092661 A1 | 4/2007 | Ryuzaki et al. | |
| 2007/0128864 A1 | 6/2007 | Ma et al. | |
| 2007/0173073 A1 | 7/2007 | Weber | |
| 2007/0181966 A1 | 8/2007 | Watatani et al. | |
| 2007/0232071 A1 | 10/2007 | Balseanu et al. | |
| 2007/0232082 A1 | 10/2007 | Balseanu et al. | |
| 2007/0275569 A1 | 11/2007 | Moghadam et al. | |
| 2007/0281495 A1 | 12/2007 | Mallick et al. | |
| 2007/0281496 A1 | 12/2007 | Ingle et al. | |
| 2008/0085607 A1 | 4/2008 | Yu et al. | |
| 2008/0102223 A1 | 5/2008 | Wagner et al. | |
| 2009/0061647 A1 | 3/2009 | Mallick et al. | |
| 2009/0104755 A1 | 4/2009 | Mallick et al. | |

FOREIGN PATENT DOCUMENTS

| | | |
|---|---|---|
| EP | 0892083 A1 | 1/1999 |
| EP | 1717848 A | 11/2006 |
| JP | 01241826 A | 9/1989 |
| KR | 10-2004-0091978 A | 11/2004 |
| KR | 10-2005-0094183 A | 9/2005 |
| WO | WO 02/077320 A1 | 10/2002 |
| WO | WO 03/066933 A | 8/2003 |
| WO | WO 2005/078784 A | 8/2005 |
| WO | WO 2007/040856 A2 | 4/2007 |
| WO | WO 2007/140376 A | 12/2007 |
| WO | WO 2007/140424 A | 12/2007 |

OTHER PUBLICATIONS

PCT International Search Report and Written Opinion mailed Jan. 6, 2009, International Application No. PCT/US08/82365, 12 pages.

Coltrin, M.E., et al., "Chemistry of AlGaN Particulate Formation," National Nuclear Security Administration, Physical, Chemical, & Nano Sciences Center, Research Briefs, 2005, pp. 42-43.

Kang, Hun, "A Study of the Nucleation and Formation of Multifunctional Nanostructures using GaN-Based Materials for Device Applications," Georgia Institute of Technology, Doctor of Philosophy in the School of Electrical & Computer Engineering Dissertation, Dec. 2006, p. 14.

PCT International Search Report and Written Opinion mailed Apr. 12, 2010, International Application No. PCT/US2009/055073, 12 pages.

EP Search Report mailed Jun. 9, 2009; Application No. 08167338.6, 9 pages.

Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY.; US, vol. 4, No. 3, Part 01, May 1, 1986, pp. 480-485.

Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.

Lucovsky, G. et al., "Deposition of silicon dioxide and silicon nitride by remote plasma enhanced chemical vapor deposition," Journal of Vacuum Science & Technology, vol. 4, No. 3, (May-Jun. 1986), pp. 681-688.

PCT International Search Report and Written Opinion mailed on Jul. 30, 2008 by the European Patent Office, International Application No. PCT/US2007/081139, 19 pages.

Chinese Office Action (and English translation) mailed Nov. 17, 2009 in Chinese Application No. 200780020052.3.

* cited by examiner

DEPOSITION-PLASMA CURE CYCLE PROCESS TO ENHANCE FILM QUALITY OF SILICON DIOXIDE

CROSS-REFERENCES TO RELATED APPLICATIONS

This application claims the benefit of U.S. Provisional Application No. 60/803,481 filed May 30, 2006. This application is also related to co-assigned U.S. Provisional App. No. 60/803,493, by Ingle et al, filed May 30, 2006 and titled "CHEMICAL VAPOR DEPOSITION OF HIGH QUALITY FLOW-LIKE SILICON DIOXIDE USING A SILICON CONTAINING PRECURSOR AND ATOMIC OXYGEN". This application is also related to U.S. Provisional Application No. 60/803,489, by Nemani et al, filed May 30, 2006 and titled "A METHOD FOR DEPOSITING AND CURING LOW-K FILMS FOR GAPFILL AND CONFORMAL FILM APPLICATIONS". In addition, this application is related to U.S. Provisional Application No. 60/803,499 by Lubomirsky, filed May 30, 2006 and titled "PROCESS CHAMBER FOR DIELECTRIC GAPFILL". The entire contents of the priority U.S. Provisional patent application and the related applications are herein incorporated by reference for all purposes.

BACKGROUND OF THE INVENTION

As the device density on integrated circuits continues to increase, the size and distance between device structures continue to decrease. The narrower widths in the gaps of the structures and the trenches between structures increases the ratio of height to width (i.e., the aspect ratio) in these formations. In other words, the continued miniaturization of integrated circuit elements is shrinking the horizontal width within and between these elements faster than their vertical height.

While the ability to make device structures with ever increasing aspect ratios has allowed more of the structures (e.g., transistors, capacitors, diodes, etc.) to be packed onto the same surface area of a semiconductor chip substrate, it has also created fabrication problems. Once of these problems is the difficulty of completely filling the gaps and trenches in these structures without creating a void or seam during the filling process. Filling gaps and trenches with dielectric materials like silicon oxide is necessary to electrically isolate nearby device structures from each other. If the gaps were left empty, there would be too much electrical noise, and current leakage for the devices to operate properly (or at all).

When gap widths were larger (and aspect ratios smaller) the gaps were relatively easy to fill with a rapid deposit of a dielectric material. The deposition material would blanket the sides and bottom of the gap and continue to fill from the bottom up until the crevice or trench was fully filled. As aspect ratios increased however, it became more difficult to fill the deep, narrow trench without having a blockage start a void or seam in the fill volume.

Voids and seams in a dielectric layer cause create problems both during semiconductor device fabrication and in the finished devices. The voids and seams are formed randomly in the dielectric layer and have unpredictable sizes, shapes, locations and population densities. This results in unpredictable and inconsistent post-deposition processing of the layer, such as even etching, polishing, annealing, etc. The voids and seams in the finished devices also create variations in the dielectric qualities of gaps and trenches in device structures. This can result in uneven, and inferior device performance due to electrical crosstalk, charge leakage, and even shorting within and between device elements.

Techniques have been developed to minimize the formation of voids and seams during deposition of dielectric materials on high aspect ratio structures. These include slowing the deposition rate of the dielectric material so it stays more conformal to the sidewalls and bottom of the trench. A more conformal deposition can reduce the degree to which the deposited material builds up at the top or middle of the trench and eventually seals off the top of a void. Unfortunately however, slowing the deposition rate means increasing the deposition time, which reduces processing efficiency and production rates.

Another technique to control void formation is to increase the flowability of the deposited dielectric material. A material with more flowability can more quickly fill a void or seam and prevent it from becoming a permanent defect in the fill volume. Increasing the flowability of an silicon oxide dielectric material often involves adding water vapor or peroxide (e.g., $H_2O_2$) to the mix of precursors used to form the oxide layer. The water vapor creates more Si—OH bonds in the deposited film, which impart an increased flowability to the film. Unfortunately however, increasing the moisture level during a silicon oxide deposition can also adversely effect the properties of the deposited film, including its density (i.e., an increased wet etch rate ratio (WERR)) and dielectric properties (i.e., an increased k-value).

Thus, there remains a need for dielectric deposition systems and processes that can deposit voidless, seamless, dielectric films into gaps, trenches, and other device structures with high aspect ratios. There also remains a need for systems and processes that can deposit a dielectric materials at high deposition rates and flowability characteristics that do not adversely effect the quality of the finished fill. These and other aspects of dielectric film deposition are addressed by the present invention.

BRIEF SUMMARY OF THE INVENTION

Embodiments of the invention include methods of filling a gap on a substrate with silicon oxide. The methods may include the steps of introducing an organo-silicon precursor and an oxygen precursor to a deposition chamber, reacting the precursors to form a first silicon oxide layer in the gap on the substrate, and etching the first silicon oxide layer to reduce the carbon content in the layer. The methods may also include forming a second silicon oxide layer on the first layer, and etching the second layer to reduce the carbon content in the layer. The silicon oxide layers may be annealed after the gap is filled.

Embodiments of the invention also include methods of forming a multilayer silicon oxide film on a substrate. The methods may include the steps of forming a plurality of silicon oxide layers on the substrate, where each silicon oxide layer has a thickness of about 100 Å to about 200 Å. The layers may be formed by: (i) introducing an organo-silicon precursor and an atomic oxygen precursor to a reaction chamber, (ii) reacting the precursors to form the layer on the substrate, and (iii) etching the layer to reduce impurities in the layer. The plurality of layers may then be annealed.

Embodiments of the invention still further include systems for performing a multi-cycle, silicon oxide bottom-up gapfills of gaps on wafer substrates. The systems may include a deposition chamber in which the gap containing substrate is held, and a remote plasma generating system coupled to the deposition chamber, where the plasma generating system is used to generate an atomic oxygen precursor. The systems may also include an organo-silicon precursor source used to supply an organo-silicon precursor to the deposition chamber, and a precursor handling system used to direct flows of the atomic oxygen precursor and the silicon precursor into the deposition chamber. The precursor handling system keeps the atomic oxygen and silicon precursors from mixing before they enter the deposition chamber. The system still further includes an etching system to etch individual silicon oxide layers deposited during each cycle of the multi-cycle gapfill.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Systems and methods are described for multilayer, multi-cycle depositions of silicon oxide in gaps and on surfaces of a wafer substrate. Each oxide layer is thin enough (e.g., about 50 Å to about 300 Å) to allow an etch process to dissociate and remove impurities such as organic and hydroxyl groups that can adversely effect the quality and dielectric properties of the film. When a plurality of the oxide layers have been deposited and etched, an anneal may be done to form the layers into a high-quality, low-k silicon oxide film.

The silicon oxide may be formed from a reaction of highly reactive atomic oxygen and an organo-silicon precursor, such as OMCATS. The atomic oxygen may first be generated outside the chamber were the deposition occurs, and kept isolated from the organo-silicon precursor until they are mixed in the chamber. The resulting silicon oxide is carbon rich and highly flowable, providing a deposition film that easily flows to the bottoms of narrow gaps and trenches. After an etch process removes at least some of the larger carbon groups and hydroxyl groups in the deposited film, a subsequent oxide deposition may flow over the first layer and be etched into the next oxide layer. The cycle may be repeated several more times until, for example, a gap or trench is filled from the bottom up by a plurality of silicon oxide layers. This multicycle process has been referred to as a bottom-up gapfill. Additional details about the methods, products, and systems of the invention will now be discussed.

Exemplary Oxide Layer Formation Processes

Figure 1:
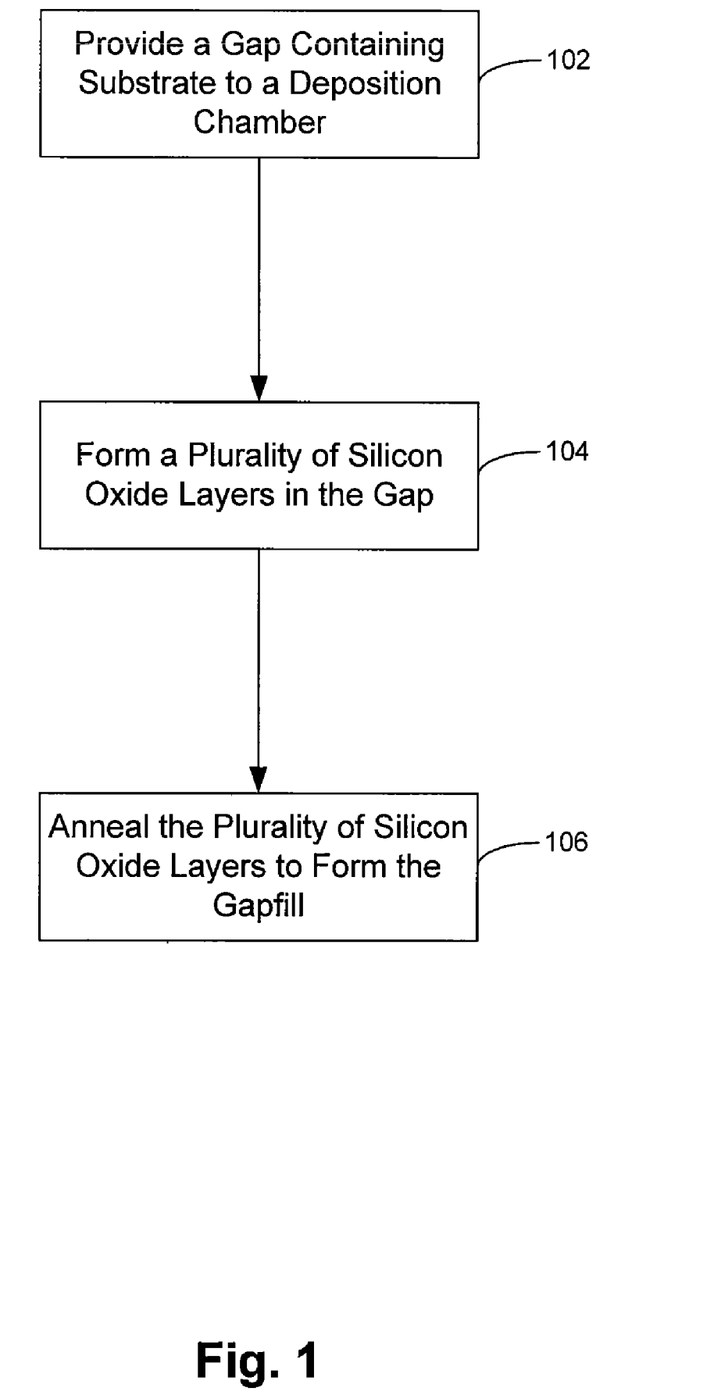
FIG. 1 is a flowchart showing a simplified overview a multi-cycle silicon oxide layer deposition according to embodiments of the invention.

FIG. 1 shows a flowchart of a simplified overview a multi-cycle silicon oxide layer deposition according to embodiments of the invention. The method 100 shown includes providing a gap containing substrate to a deposition chamber 102. The substrate may have structures formed thereon that include gaps, trenches, etc., with height to width aspect ratios of about 5:1 or more, 7:1 or more, 10:1 or more, 13:1 or more, 15:1 or more, etc.

A plurality of silicon oxide layers are then formed in the gaps (and on other surfaces) of the substrate 104. The silicon oxide may be deposited by reaction an oxygen containing precursor and an organo-silicon precursor in the reaction chamber. The oxygen containing precursor may include atomic oxygen that was remotely generated outside the deposition chamber. The atomic oxygen may be generated by the dissociation of a precursor such as molecular oxygen ($O_2$), ozone ($O_3$), an nitrogen-oxygen compound (e.g., NO, $NO_2$, $N_2O$, etc.), a hydrogen-oxygen compound (e.g., $H_2O$, $H_2O_2$, etc.), a carbon-oxygen compound (e.g., CO, $CO_2$, etc.), as well as other oxygen containing precursors and combinations of precursors.

The dissociation of the precursor to generate the atomic oxygen may also be done by thermal dissociation, ultraviolet light dissociation, and/or plasma dissociation, among other methods. Plasma dissociation may involve striking a plasma from helium, argon, etc., in a remote plasma generating chamber and introducing the oxygen precursor to the plasma to generate the atomic oxygen precursor.

The atomic oxygen may be first introduced to the organo-silicon precursor in the chamber. The organo-silicon precursor may include compounds with direct Si—C bonding and/or compounds with Si—O—C bonding. Examples of organosilane silicon precursors may include dimethylsilane, trimethylsilane, tetramethylsilane, diethylsilane, tetramethylorthosilicate (TMOS), tetraethylorthosilicate (TEOS), octamethyltrisiloxane (OMTS), octamethylcyclotetrasiloxane (OMCTS), tetramethylcyclotetrasiloxane (TOMCATS), DMDMOS, DEMS, methyl triethoxysilane (MTES), phenyldimethylsilane, and phenylsilane, among others.

The organo-silicon precursor may be mixed with a carrier gas before or during its introduction to the deposition chamber. A carrier gas may be an inactive gas that does not unduly interfere with the formation of the oxide film on the substrate. Examples of carrier gases include helium, neon, argon, and hydrogen ($H_2$), among other gases.

In embodiments of method 100, the atomic oxygen and organo-silicon precursors are not mixed before being introduced to the deposition chamber. The precursors may enter the chamber through separate spatially separated precursor inlets distributed around reaction chamber. For example, the atomic oxygen precursor may enter from an inlet (or inlets) at the top of the chamber and positioned directly above the substrate. The inlet directs the flow of the oxygen precursor in a direction perpendicular to the substrate deposition surface.

Meanwhile, the silicon precursor may enter from one or more inlets around the sides of the deposition chamber. The inlets may direct the flow of the silicon precursor in a direction approximately parallel to the deposition surface.

Additional embodiments include sending the atomic oxygen and silicon precursors through separate ports of a multi-port showerhead. For example, a showerhead positioned above the substrate may include a pattern of openings for the precursors to enter the deposition chamber. One subset of openings may be supplied by the atomic oxygen precursor, while a second subset of openings is supplied by the silicon precursor. Precursors traveling through different sets of opening may be fluidly isolated from each other until exiting into the deposition chamber. Additional details about types and designs of precursor handling equipment is described in a co-assigned U.S. Provisional Patent Application 60/803,499 by Lubomirsky, and titled "PROCESS CHAMBER FOR DIELECTRIC GAPFILL", filed on the same day as the present application, the entire contents of which are hereby incorporated by reference for all purposes.

As the atomic oxygen and silicon precursors react in the deposition chamber, they form the silicon oxide layer on the substrate deposition surface. The initial oxide layer has excellent flowability, and can quickly migrate to the bottoms of the gaps in the structures on the substrate surface.

After each oxide layer is deposited, an etch step may be performed on the layer to remove impurities. This may include dissociating larger organic groups into smaller carbon containing molecules, and dissociating at least some of the Si—OH bonds to form water and silicon oxide.

Following the deposition and etching of the plurality of silicon oxide layers, an anneal may be performed to further drive out moisture and turn the layers into a dense, high-quality oxide film. Embodiments include performing an anneal after all the individual layers of silicon oxide have been deposited and etched. Additional embodiments may include intermediate anneals after one or more of the layers are formed, but before a final anneal of all the layers. For example, intermediate anneals may be done after every, 2, 3, 4, 5, etc., layers are deposited, followed by a final anneal of all the layers.

Figure 2:
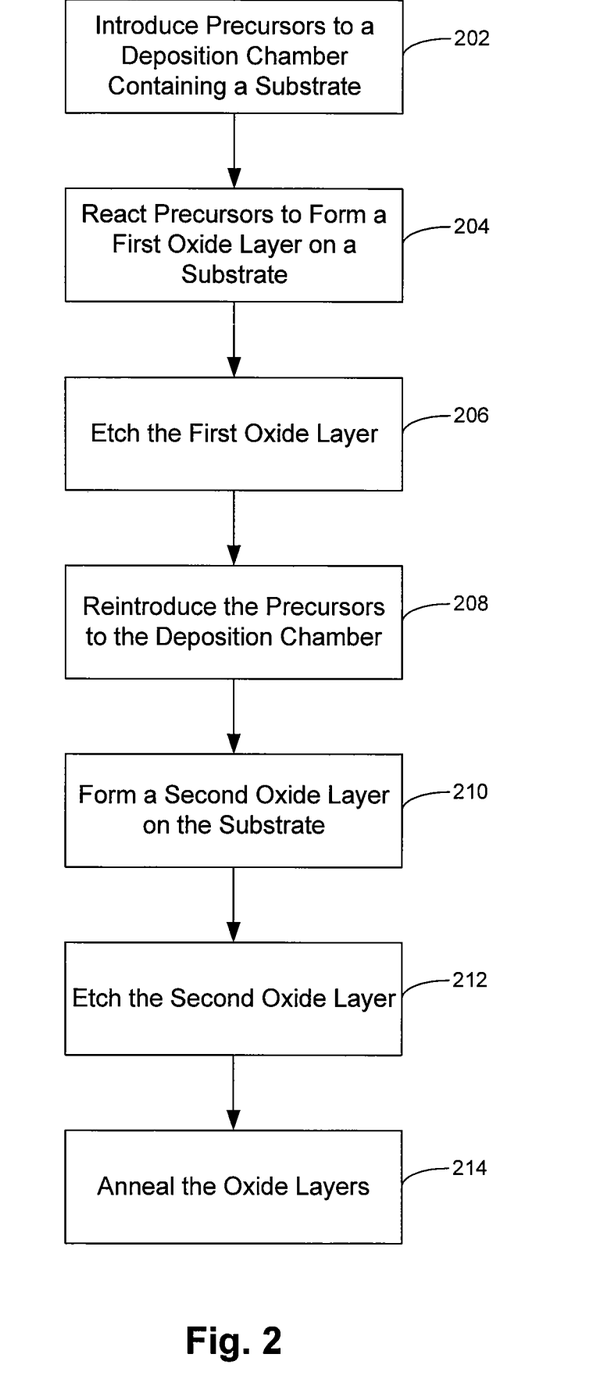
FIG. 2 is a flowchart illustrating methods of making a multilayer silicon oxide film according to embodiments of the invention.

Referring now to FIG. 2, a flowchart illustrating a method 200 of making a multilayer silicon oxide film according to embodiments of the invention is shown. The method 200 may include introducing precursors to a deposition chamber containing a substrate 202. As noted above, the precursors may include an atomic oxygen precursor and an organo-silicon precursor. The atomic oxygen may be generated in a remote high-density plasma generator supplying 4000 to 6000 Watts (e.g., 5500 Watts) of RF power to a combined gas stream of argon gas flowing at, for example, about 900 to 1800 sccm with molecular oxygen ($O_2$) flowing at, for example, about 600 to about 1200 sccm.

The organo-silicon precursor may be introduced to the deposition chamber by mixing an organo-silicon compound (gas or liquid) with a carrier gas such as helium or molecular hydrogen ($H_2$). For example, helium may be bubbled at a flow rate of about 600 to about 2400 sccm through a room-temperature liquid organo-silicon precursor such as octamethyl-cyclotetrasiloxane (OMCTS) to provide a flow of OMCTS to the chamber at a rate of about 800 to about 1600 mgm.

The precursors react with one another in the chamber to form a first oxide layer on the substrate 204. The total pressure in the chamber during the oxide layer deposition may be, for example, about 0.5 Torr to about 6 Torr. Higher total pressures (e.g., 1.3 Torr) may deposit a oxide film with more flow-like qualities, while lower pressures (e.g., 0.5 Torr) may deposit a more conformal oxide layer. Because the atomic oxygen is highly reactive, the deposition temperature in the reaction chamber may be relatively low (e.g., about 100° C. or less). Oxide deposition rates may range from about 125 Å/min to about 2 µm/min (e.g., about 500 Å/min to about 3000 Å/min; about 1500 Å/min, etc.). The thickness of the layer may be about 50 Å to about 500 Å (e.g., about 100 Å to about 200 Å).

After the first oxide layer is formed, the flow of the precursors into the chamber may stop, and the first oxide layer may be etched 206. The etching step may be used to dissociate and remove impurities in the layer, and also to planarize the layer. As noted below in the description of FIG. 3, the etching process may include a single etch step, or multiple etch steps.

Following the etching of the first layer, the precursors are reintroduced to the deposition chamber 208, and react to form a second oxide layer on the substrate 210. The second oxide layer may be formed under the same reaction conditions as the first layer, or may be formed under a different conditions (e.g., chamber pressure, temperature, organo-silicon precursor, etc.).

After the second layer has been formed it also may be etched 212 to reduced impurity levels and/or planarize the layer. The second layer may be etched using the same process as used to etch the first layer, or may be etched using a different process, (e.g., different number of etching steps, different etch precursors, different power level, etc.).

Following the formation and etching of the second silicon oxide layer (and any additional oxide layers) the oxide layers may be annealed 214 to form a uniform, high-quality silicon oxide gapfill. The final gapfill may have a dielectric constant (i.e., k-value) of less than 4.0 (e.g., less than about 3.5; less than about 3.0, etc.), and a wet-etch rate ratio (WERR) of less than 2:1 (e.g., about 1.8:1 to about 1.4:1). The gapfill may be uniform throughout the fill volume, and contain few, if any, voids or seams.

Figure 3:
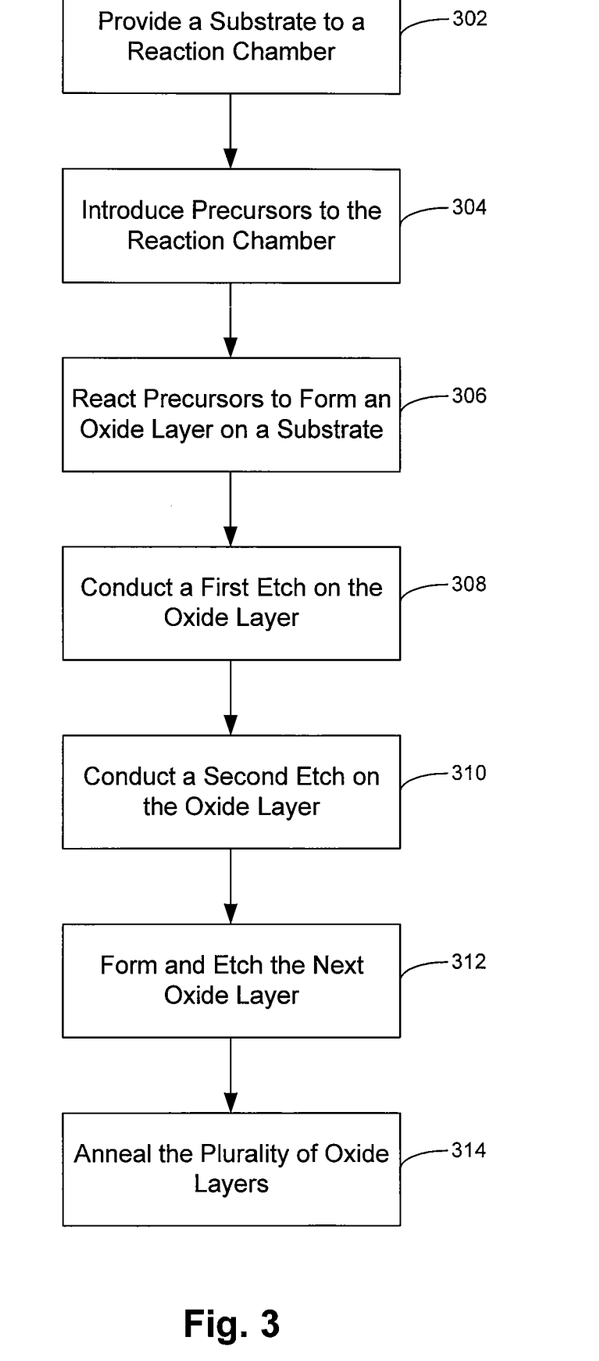
FIG. 3 is a flowchart that highlights a two-stage etching step in methods of making a multilayer silicon oxide film according to embodiments of the invention.

FIG. 3 shows a flowchart that highlights a two-stage etching step in a method 300 of making a multilayer silicon oxide film according to embodiments of the invention. The method 300 includes providing a substrate to a reaction chamber 302, and introducing precursors (e.g., oxygen and silicon precursors) to the reaction chamber 304. The precursors then react to form a silicon oxide layer on the substrate 306, which then undergoes the two-stage etch.

The two-stage etch starts by conducting a first etch on the oxide layer 308. This first etch may include using a lower-density plasma to dissociate larger organic molecules and remove at least a portion of the carbon in the layer. This lower-density plasma etch may include using an RPS system to generate an $Ar/O_2$ plasma that etches the oxide layer. The etch conditions may include, for example, striking a plasma from a flow of 1600 sccm $O_2$ and 400 sccm argon at a power of about 5500 Watts and introducing it to the deposition chamber at a pressure of about 760 mTorr. This plasma etch can dissociate larger carbon groups and remove carbon impurities from the oxide layer.

Following the first etch, a second etch of the oxide layer is conducted 310 at a higher plasma density to remove at least a portion of the hydroxyl groups in the layer. This higher-density plasma etch may include exposing the layer to a plasma formed from the dissociation of a flow of molecular oxygen (e.g., 600 sccm) with a high-power RF field (e.g., 6000 Watts). The oxygen plasma may be introduced to the deposition chamber at a pressure of, for example, 8 mTorr, and react with the —OH groups in the oxide layer to form silicon dioxide and water.

The deposition and etch cycles may be repeated with a next oxide layer 312 formed on top of the previous layer. The deposited and etched oxide layers are then built up until a predetermined number of layers and/or film thickness is reached, and the plurality of layers are annealed 314. The anneal may be done in a single step, or multiple steps. A single step anneal may be done, for example, by heating the plurality of layers to about 300° C. to about 1000° C. (e.g., about 600° C. to about 900° C.) in a substantially dry atmosphere (e.g., dry nitrogen, helium, argon, etc.). The anneal removes moisture from the deposited layer and further converts Si—OH groups into silicon oxide.

Multi-step anneals may include a two-step anneal where the layers first undergo a wet anneal stage, such as heating the layer to, for example, about 700° C. in the presence of steam. This may be followed by a dry anneal stage, where the layers are heated to a higher temperature (e.g., about 900° C.) in an atmosphere that is substantially free of moisture (e.g., dry $N_2$). The first, wet anneal, may help hydrolyze additional Si—C bonds with Si—OH bonds, while the dry anneal converts the Si—OH into silicon oxide bonds and drives off moisture from the layers.

In addition to wet and dry thermal annealing, other annealing techniques (alone or in combination) may be used to anneal the plurality of oxide layers. These include a steam anneal, a plasma anneal, an ultraviolet light anneal, an e-beam anneal, and/or a microwave anneal, among others.

Figure 4:
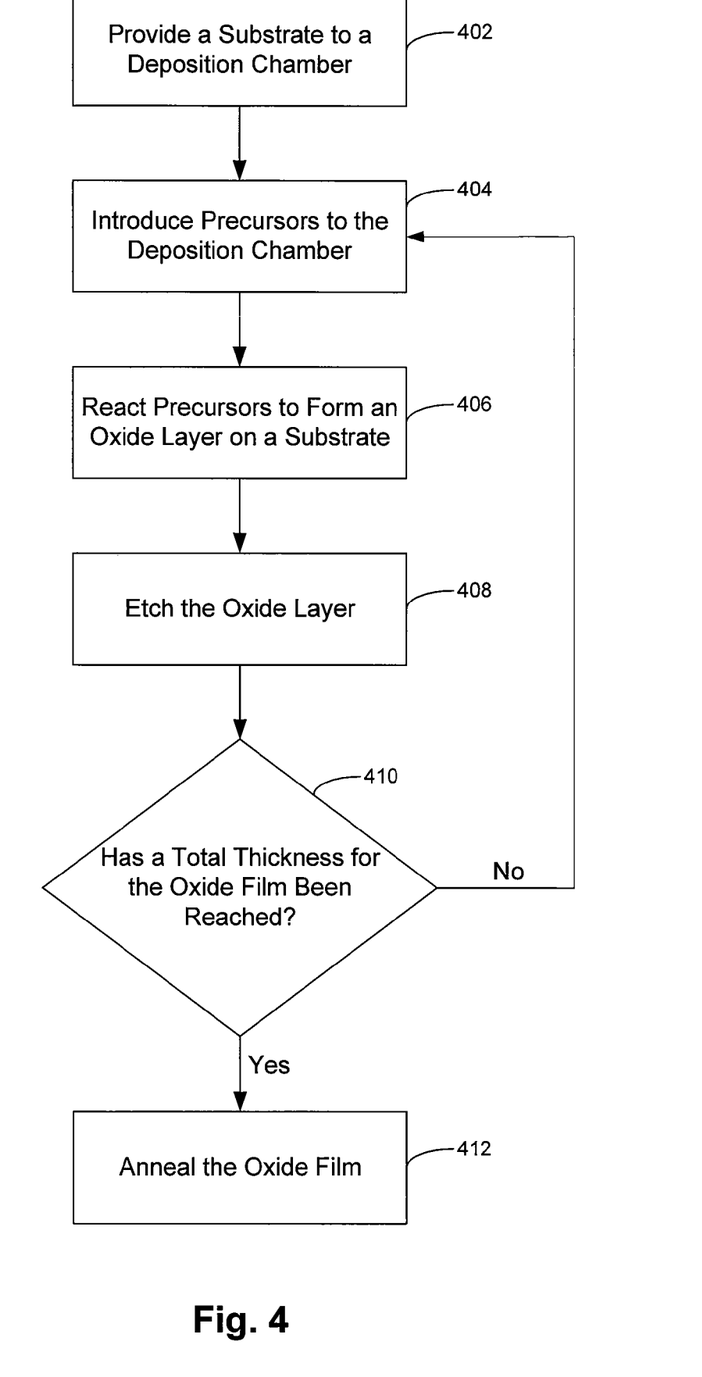
FIG. 4 is another flowchart illustrating methods of making a multilayer silicon oxide film according to embodiments of the invention.

Referring now to FIG. 4, another flowchart illustrating a method 400 of making a multilayer silicon oxide film according to embodiments of the invention is shown. The method 400 includes providing a substrate to a deposition chamber 402 and introducing precursors (e.g., atomic oxygen and organo-silicon precursors) to the chamber 404. The precursors react to form a silicon oxide layer on the substrate 406, and then the oxide layer may be etched 408.

At this point, a check may be made to determine if the cumulative thickness of the deposited oxide layers has reached a preset point 410. If the preset thickness level of the total oxide film has been reached, then the deposition and etch cycle may end, and the film may be annealed 412. However, if the thickness level has not been met, then another oxide deposition and etch cycle may occur to add at least one more additional layer to the oxide film.

Determining whether the oxide film has reached a predetermined thickness may be done by a thickness measurement of the deposited and etched layers, or may be done by calculating the number of layers need to reach a desired film thickness. For example, if each deposited and etched layer is 100 Å thick, and the desired film thickness 1.2 µm, then 12 deposition and etch cycles should be done to form the film. The thickness of each deposited layer may be set by controlling the parameters that effect the oxide deposition rate, such as the types and flow rates of the reactive precursors, the total pressure in the deposition chamber, and the temperature, among other parameters. As noted above, typical deposition rates for the oxide layers are about 500 Å/min to about 3000 Å/min (e.g., about 1500 Å/min).

Figure 5A:
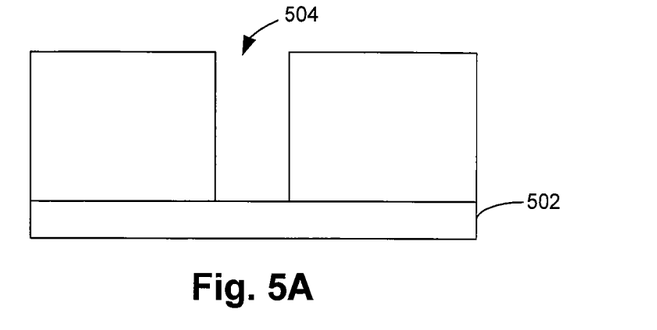
FIGS. 5A-F show a substrate having a gap structure that is progressively filled with a multilayer silicon oxide film according to embodiments of the invention.

FIGS. 5A-F show a substrate having a gap structure that is progressively filled with a multilayer silicon oxide film using embodiments of the multicycle deposition-etch oxide layer formation process. FIG. 5A shows a substrate 502 on which a gap 504 has been formed. It will be appreciated that gap 504 shown in FIGS. 5A-F has been drawn with a relatively low aspect ratio to more clearly show the progression of the oxide fill layers. Embodiments of the present gapfill methods may include void and seam free depositions into gaps having aspect ratios of 5:1, 6:1, 7:1, 8:1, 9:1, 10:1, 11:1, 12:1, 13:1, 14:1, and 15:1 or more.

Figure 5B:
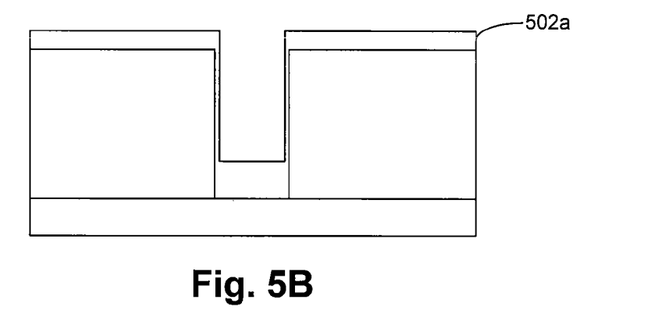

FIG. 5B shows a first oxide layer 506a deposited in gap 504. The silicon oxide that formed the layer has good flowability qualities, allowing the film to quickly migrate to the bottom of gap 504. Thus, the thickness of the deposited oxide at the bottom of the gap 504 may be greater than the oxide thickness along the sidewalls of the gap.

Figure 5C:
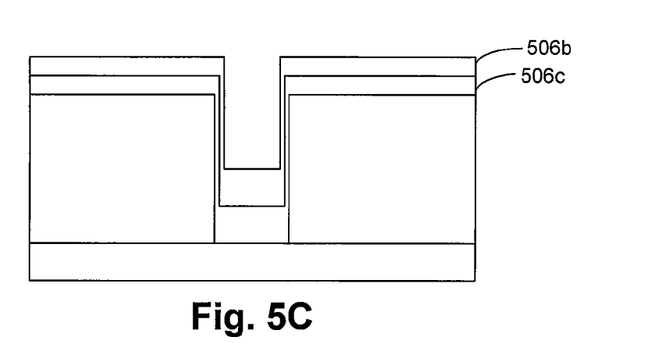
Figure 5D:
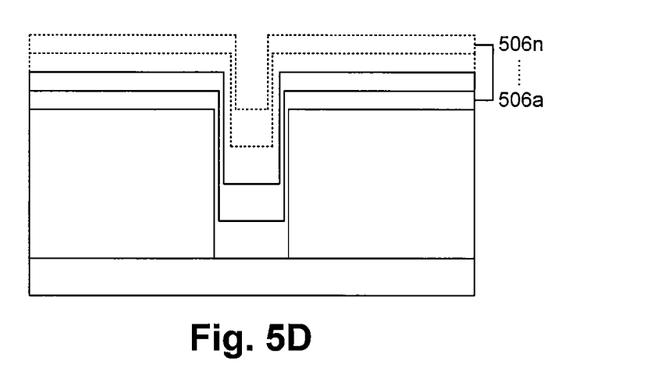

FIGS. 5C and D show additional oxide layers 506b, 506c, etc., being deposited on previously deposited and etched layers in the gap 504. These additional layers may be formed from the bottom up in the gap 504, until a desired oxide film thickness level is reached (e.g., the top of gap 504).

Figure 5E:
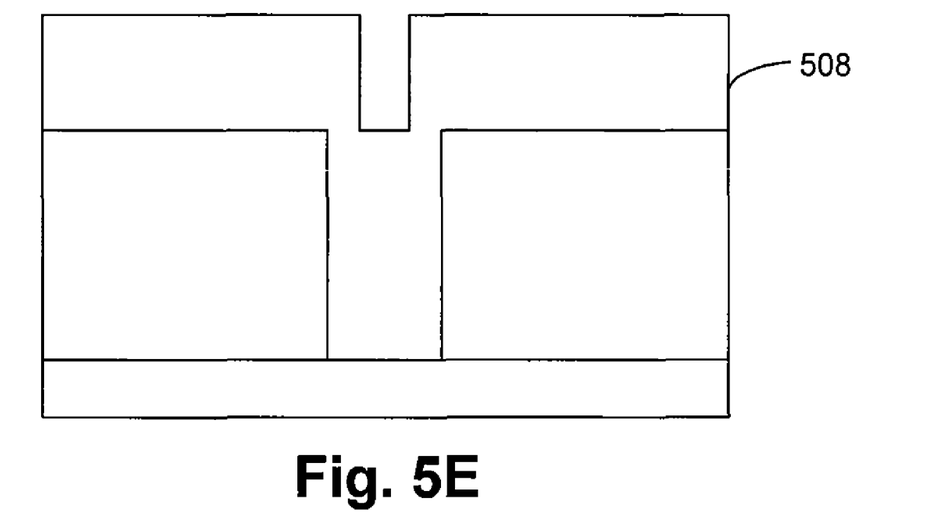
Figure 5F:
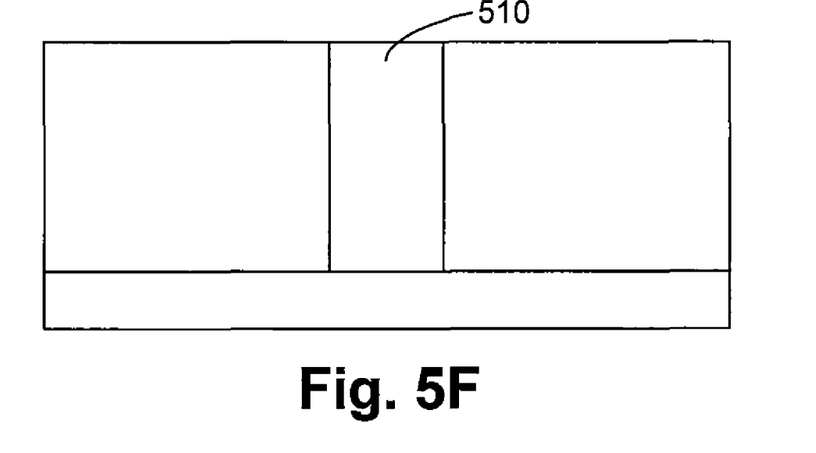

Once the last of the plurality of the oxide layers is deposited and etched, an anneal may be conducted to form the layers into a uniform film 508, as shown in FIG. 5E. The film may be planarized by, for example, plasma etching or CMP to remove deposition materials formed over the top of the gap 504. FIG. 5F shows the remaining silicon oxide gapfill 510, having few, if any, voids or seams, and having high film-quality and dielectric characteristics.

Exemplary Substrate Processing System

Deposition systems that may implement embodiments of the present invention may include high-density plasma chemical vapor deposition (HDP-CVD) systems, plasma enhanced chemical vapor deposition (PECVD) systems, sub-atmospheric chemical vapor deposition (SACVD) systems, and thermal chemical vapor deposition systems, among other types of systems. Specific examples of CVD systems that may implement embodiments of the invention include the CENTURA ULTIMA™ HDP-CVD chambers/systems, and PRODUCER™ PECVD chambers/systems, available from Applied Materials, Inc. of Santa Clara, Calif.

Figure 6A:
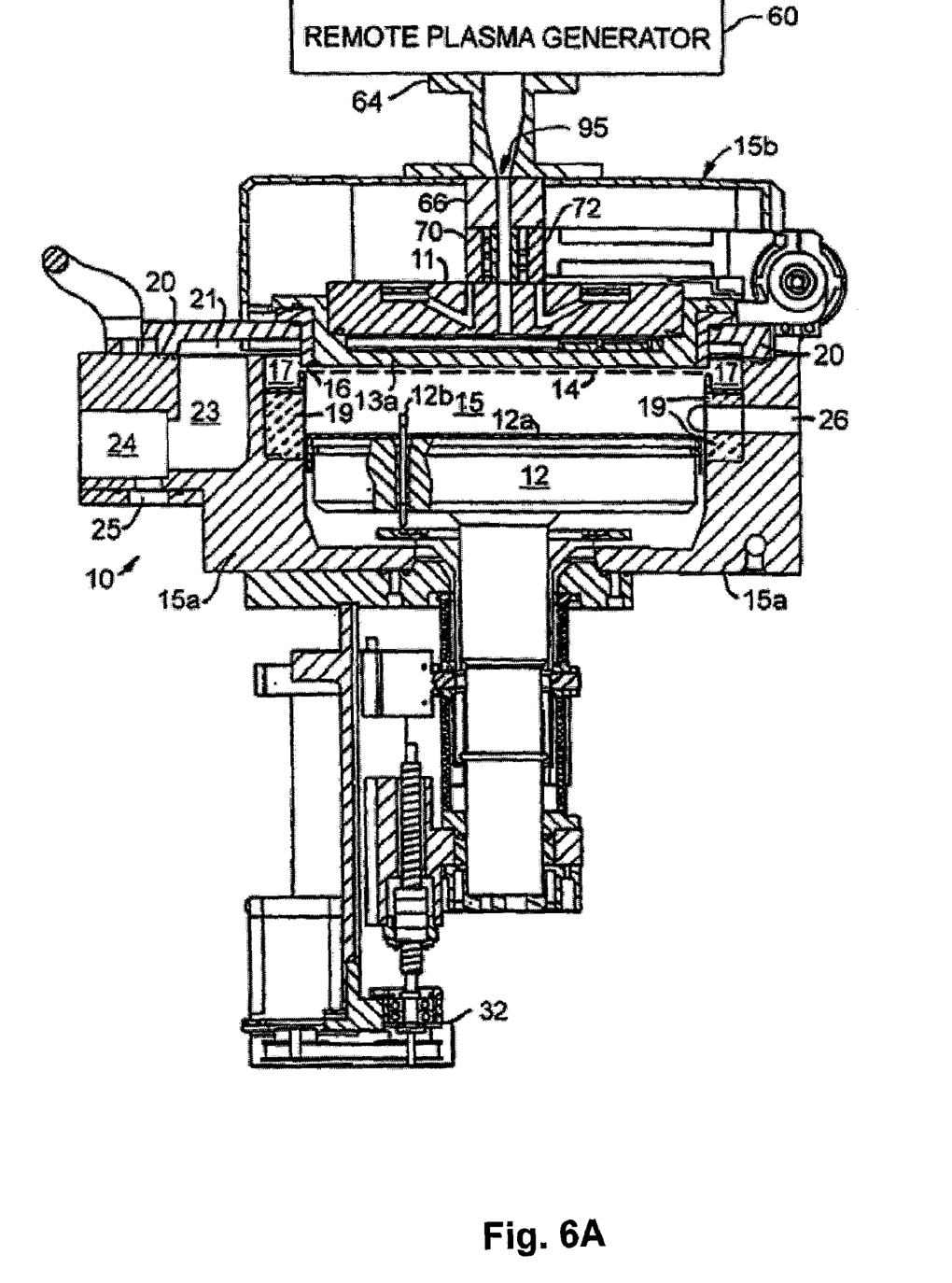
FIG. 6A shows a vertical cross-sectional view of a substrate processing system that may be used to form silicon oxide layers according to embodiments of the invention.

One suitable substrate processing system in which can be modified to utilize embodiments in accordance with the present invention is shown and described in co-assigned U.S. Pat. Nos. 6,387,207 and 6,830,624, which are incorporated herein by reference for all purposes. FIG. 6A is vertical, cross-sectional views of a CVD system 10, having a vacuum or processing chamber 15 that includes a chamber wall 15a and a chamber lid assembly 15b.

The CVD system 10 contains a gas distribution manifold 11 for dispersing process gases to a substrate (not shown) that rests on a heated pedestal 12 centered within the process chamber 15. Gas distribution manifold 11 may be formed from an electrically conducting material in order to serve as an electrode for forming a capacitive plasma. During processing, the substrate (e.g. a semiconductor wafer) is positioned on a flat (or slightly convex) surface 12a of the pedestal 12. The pedestal 12 can be moved controllably between a lower loading/off-loading position (depicted in FIG. 6A) and an upper processing position (indicated by dashed line 14 in FIG. 6A), which is closely adjacent to the manifold 11. A centerboard (not shown) includes sensors for providing information on the position of the wafers.

Deposition and carrier gases are introduced into the chamber 15 through perforated holes 13b of a conventional flat, circular gas distribution faceplate 13a. More specifically, deposition process gases flow into the chamber through the inlet manifold 11, through a conventional perforated blocker plate 42 and then through holes 13b in gas distribution faceplate 13a.

Before reaching the manifold 11, deposition and carrier gases are input from gas sources 7 through gas supply lines 8 into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in the CVD system 10 can be either a thermal process or a plasma-enhanced process. In a plasma-enhanced process, an RF power supply 44 applies electrical power between the gas distribution faceplate 13a and the pedestal 12 so as to excite the process gas mixture to form a plasma within the cylindrical region between the faceplate 13a and the pedestal 12. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15. In a thermal process, the RF power supply 44 would not be utilized, and the process gas mixture thermally reacts to deposit the desired films on the surface of the semiconductor wafer supported on the pedestal 12, which is resistively heated to provide thermal energy for the reaction.

During a plasma-enhanced deposition process, the plasma heats the entire process chamber 10, including the walls of the chamber body 15a surrounding the exhaust passageway 23 and the shut-off valve 24. When the plasma is not turned on or during a thermal deposition process, a hot liquid is circulated through the walls 15a of the process chamber 15 to maintain the chamber at an elevated temperature. The passages in the remainder of the chamber walls 15a are not shown. Fluids used to heat the chamber walls 15a include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber 15 by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360.degree. circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in co-assigned U.S. Pat. No. 5,558,717 entitled "CVD Processing Chamber," issued to Zhao et al, and hereby incorporated by reference in its entirety.

A lift mechanism and motor 32 (FIG. 6A) raises and lowers the heater pedestal assembly 12 and its wafer lift pins 12b as wafers are transferred into and out of the body of the chamber 15 by a robot blade (not shown) through an insertion/removal opening 26 in the side of the chamber 10. The motor 32 raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller over control lines 36, of which only some are shown. Controller 34 relies on feedback from optical sensors to determine the position of movable mechanical assemblies such as the throttle valve and susceptor which are moved by appropriate motors under the control of controller 34.

In the exemplary embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, the memory 38 is a hard disk drive, but the memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

A process for depositing a film on a substrate or a process for cleaning the chamber 15 can be implemented using a computer program product that is executed by the controller 34. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

Figure 6B:
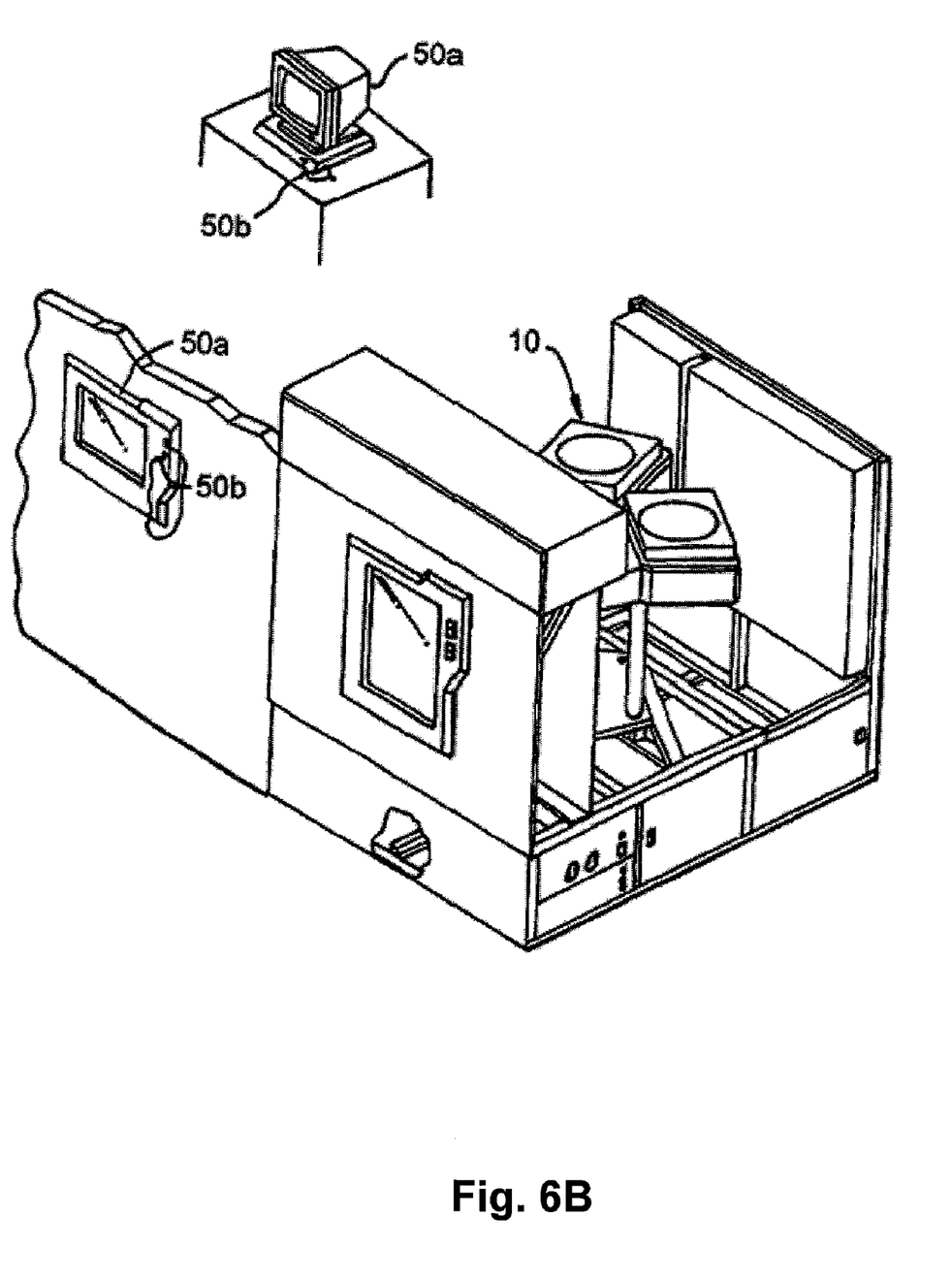
FIG. 6B is a simplified diagram of a system monitor/controller component of a substrate processing system according to embodiments of the invention.

The interface between a user and the controller 34 is via a CRT monitor 50a and light pen 50b, shown in FIG. 6B, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

FIG. 6A shows a remote plasma generator 60 mounted on the lid assembly 15b of the process chamber 15 including the gas distribution faceplate 13a and the gas distribution manifold 11. A mounting adaptor 64 mounts the remote plasma generator 60 on the lid assembly 15b, as best seen in FIG. 6A. The adaptor 64 is typically made of metal. A mixing device 70 is coupled to the upstream side of the gas distribution manifold 11 (FIG. 6A). The mixing de-vice 70 includes a mixing insert 72 disposed inside a slot 74 of a mixing block for mixing process gases. A ceramic isolator 66 is placed between the mounting adaptor 64 and the mixing device 70 (FIG. 6A). The ceramic isolator 66 may be made of a ceramic material such as $Al_2O_3$ (99% purity), Teflon®, or the like. When installed, the mixing device 70 and ceramic isolator 66 may form part of the lid assembly 15b. The isolator 66 isolates the metal adaptor 64 from the mixing device 70 and gas distribution manifold 11 to minimize the potential for a secondary plasma to form in the lid assembly 15b as discussed in more detail below. A three-way valve 77 controls the flow of the process gases to the process chamber 15 either directly or through the remote plasma generator 60.

The remote plasma generator 60 is desirably a compact, self-contained unit that can be conveniently mounted on the lid assembly 15b and be easily retrofitted onto existing chambers without costly and time-consuming modifications. One suitable unit is the ASTRON® generator available from Applied Science and Technology, Inc. of Woburn, Mass. The ASTRON® generator utilizes a low-field toroidal plasma to dissociate a process gas. In one example, the plasma dissociates a process gas including a fluorine-containing gas such as $NF_3$ and a carrier gas such as argon to generate free fluorine which is used to clean film deposits in the process chamber 15.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of filling a gap on a substrate with silicon oxide, the method comprising:
    introducing an organo-silicon precursor and an oxygen precursor to a deposition chamber;
    reacting the precursors to form a first silicon oxide layer in the gap on the substrate;
    etching the first silicon oxide layer to reduce the carbon content in the layer;
    forming a second silicon oxide layer on the first layer, and etching the second layer to reduce the carbon content in the layer, wherein the etching operation of the first and second silicon oxide layers comprises:
        exposing the layer to a first plasma having a first density, wherein the first plasma dissociates larger carbon molecules in the layer, and
        exposing the layer to a second plasma having a second density that is higher than the first density, wherein the second plasma dissociates silicon-hydroxide bonds in the layer; and
    annealing the silicon oxide layers after the gap is filled.

2. The method of claim 1, wherein the organo-silicon precursor comprises dimethylsilane, trimethylsilane, tetramethylsilane, diethylsilane, tetramethylorthosilicate (TMOS), tetraethylorthosilicate (TEOS), octamethyltrisiloxane (OMTS), octamethylcyclotetrasiloxane (OMCTS), tetramethylcyclotetrasiloxane (TOMCATS), DMDMOS, DEMS, methyl triethoxysilane (MTES), phenyldimethylsilane, or phenylsilane.

3. The method of claim 1, wherein the first and second silicon oxide layers each have a thickness from about 100 Å to about 200 Å.

4. The method of claim 1, wherein the annealed silicon oxide layers have a wet etch rate ratio (WERR) of about 2:1 or less.

5. The method of claim 1, wherein the annealed silicon oxide layers have a wet etch rate ratio (WERR) of about 1.8:1 to about 1.4:1.

6. The method of claim 1, wherein the annealed silicon oxide layers have a k-value of about 4.0 or less.

7. The method of claim 1, wherein the method further comprises pretreating the substrate with a high-density plasma before introducing the precursors to the deposition chamber.

8. The method of claim 1, wherein the gap has a height to width aspect ratio of about 5:1 or more.

9. The method of claim 1, wherein the gap has a height to width aspect ratio of about 13:1 or more.

10. The method of claim 1, wherein the annealing of the silicon oxide layers comprises an anneal in a dry non-reactive gas at a temperature of about 800° C. or more.

11. The method of claim 10, wherein the non-reactive gas is nitrogen ($N_2$) and the temperature is 900° C.

12. The method of claim 1, wherein the method includes forming additional silicon oxide layers on the first and second layers, and wherein each additional silicon oxide layer has a thickness of about 50 Å to about 500 Å.

13. The method of claim 12, wherein the additional silicon oxide layers are etched in the same manner as the first and second silicon oxide layers.

14. The method of claim 12, wherein a total thickness of the silicon oxide layers is about 500 Å to about 10,000 Å.

15. The method of claim 1, wherein the oxygen precursor comprises atomic oxygen that is generated outside the deposition chamber.

16. The method of claim 15, wherein the atomic oxygen is formed by:
    forming a plasma from a gas mixture comprising argon; and
    introducing an oxygen precursor to the plasma, wherein the oxygen precursor dissociates to form the atomic oxygen.

17. The method of claim 16, wherein the oxygen precursor is selected from the group consisting of molecular oxygen, ozone, and nitrogen dioxide.

18. The method of claim 15, wherein the atomic oxygen is formed by:
    introducing an oxygen precursor into a photodissociation chamber; and
    exposing the oxygen precursor to ultraviolet light, wherein the ultraviolet light dissociates the oxygen precursor to form atomic oxygen.

19. The method of claim 15, wherein the organo-silicon precursor and the atomic oxygen are not mixed until after being introduced into the deposition chamber.

20. A method of forming a multilayer silicon oxide film on a substrate, the method comprising:
    forming a plurality of silicon oxide layers on the substrate, wherein each silicon oxide layer has a thickness of about 100 Å to about 200 Å, and wherein each layer is formed by;
    (i) introducing an organo-silicon precursor and an atomic oxygen precursor to a reaction chamber,
    (ii) reacting the precursors to form the layer on the substrate, and
    (iii) etching the layer to reduce impurities in the layer, wherein the etching of the layer comprises:
        exposing the layer to a first plasma having a first density, wherein the first plasma dissociates larger carbon molecules in the layer, and
        exposing the layer to a second plasma having a second density that is higher than the first density, wherein the second plasma dissociates silicon-hydroxide bonds in the layer; and
    annealing the plurality of layers.

21. The method of claim 20, wherein the atomic oxygen precursor is generated outside the deposition chamber, and wherein the organo-silicon and atomic oxygen precursors are not mixed until after being introduced into the reaction chamber.

22. The method of claim 20, wherein the annealing of the plurality of layers comprises a thermal anneal, a steam anneal, a plasma anneal, an ultraviolet light anneal, an e-beam anneal, or a microwave anneal.

23. The method of claim 20, wherein each of the plurality of layers is formed at a rate of about 125 Å/min to about 2 µm/min.

24. The method of claim 20, wherein each of the layers is etched in about 3 minutes or less.

25. The method of claim 20, wherein the plurality of layers is annealed in about 30 minutes or less.

26. The method of claim 20, wherein the plurality of layers have a wet etch rate ratio (WERR) of about 1.8:1 to about 1.4:1.

27. The method of claim 20, wherein the plurality of layers have a—value of about 4.0 or less.

28. The method of claim 20, wherein the multilayer silicon oxide film has a thickness of about 1000 Å to about 3000 Å.

29. The method of claim 20, wherein the annealing of the plurality of layers comprises:
    heating the substrate at a first anneal temperature in the presence of steam; and
    heating the substrate at a second anneal temperature in dry nitrogen.

30. The method of claim 29, wherein the first anneal temperature is about 650° C. and the second anneal temperature is about 900° C.

* * * * *

UNITED STATES PATENT AND TRADEMARK OFFICE
CERTIFICATE OF CORRECTION

| | | |
|---|---|---|
| PATENT NO. | : 7,902,080 B2 | Page 1 of 1 |
| APPLICATION NO. | : 11/753968 | |
| DATED | : March 8, 2011 | |
| INVENTOR(S) | : Chen et al. | |

It is certified that error appears in the above-identified patent and that said Letters Patent is hereby corrected as shown below:

In the Claims:

Claim 27, column 14, line 33, please delete "a–value" and insert --a k-value--.

Signed and Sealed this
Thirty-first Day of May, 2011

David J. Kappos
*Director of the United States Patent and Trademark Office*